US007776492B2

(12) United States Patent
Miura (10) Patent No.: US 7,776,492 B2
(45) Date of Patent: Aug. 17, 2010

(54) PHOTOMASK, MANUFACTURING METHOD THEREOF, AND MANUFACTURING METHOD OF ELECTRONIC DEVICE (75) Inventor: Hirotsuna Miura, Suwa-gun (JP)

(73) Assignee: Seiko Epson Corporation, Tokyo (JP)

( * ) Notice: Subject to any disclaimer, the term of this patent is extended or adjusted under 35 U.S.C. 154(b) by 752 days.

(21) Appl. No.: 11/367,372

(22) Filed: Mar. 6, 2006

(65) Prior Publication Data
US 2006/0203064 A1 Sep. 14, 2006

(30) Foreign Application Priority Data
Mar. 9, 2005 (JP) ............... 2005-066091

(51) Int. Cl.
*G03F 1/00* (2006.01)
*B41J 2/01* (2006.01)
(52) U.S. Cl. .......................... 430/5; 347/102
(58) Field of Classification Search ........ 430/5; 347/102
See application file for complete search history.

(56) References Cited
U.S. PATENT DOCUMENTS
| 4,609,566 A * | 9/1986 | Hongo et al. ............... 427/597 |
| 5,981,110 A * | 11/1999 | George et al. ............... 430/5 |
| 6,535,274 B2 | 3/2003 | Antoni |
| 6,599,582 B2 | 7/2003 | Kiguchi et al. |
| 2004/0189750 A1* | 9/2004 | Miura et al. ............... 347/52 |
| 2004/0226929 A1* | 11/2004 | Miura et al. ............. 219/121.85 |
| 2004/0253524 A1 | 12/2004 | Itoh |
| 2005/0130045 A1 | 6/2005 | Ozawa |

FOREIGN PATENT DOCUMENTS
| JP | S60-152027 A | 8/1985 |
| JP | S60-254729 A | 12/1985 |
| JP | S61-264344 A | 11/1986 |
| JP | H02-000963 A | 1/1990 |
| JP | 09073166 A | 3/1997 |
| JP | H11-204529 A | 7/1999 |
| JP | H11-274671 A | 10/1999 |
| JP | H11-323410 A | 11/1999 |
| JP | 2000-328252 A | 11/2000 |
| JP | 2004276591 A | 10/2004 |
| JP | 2004-342716 A | 12/2004 |
| JP | 200595849 A | 4/2005 |
| TW | 200426495 | 12/2004 |
| TW | 200428488 | 12/2004 |

* cited by examiner

*Primary Examiner*—Mark F Huff
*Assistant Examiner*—Jonathan Jelsma
(74) *Attorney, Agent, or Firm*—Global IP Counselors, LLP (57) ABSTRACT A method of manufacturing a photomask includes: ejecting droplets of a liquid containing a light-shielding material at predetermined positions on a substrate using a droplet ejection method, and drying the liquid to form a light-shielding pattern on the substrate, the light-shielding pattern containing the light-shielding material.

21 Claims, 9 Drawing Sheets

CROSS-REFERENCE TO RELATED APPLICATION

This application claims priority to Japanese Patent Application No. 2005-066091, filed Mar. 9, 2005, the contents of which are incorporated herein by reference.

BACKGROUND

1. Technical Field

The present invention relates to a photomask, a method of manufacturing the same, and a method of manufacturing an electronic device, and particularly relates to a method of manufacturing a photomask using a droplet ejection method.

2. Related Art

In the manufacturing process for electronic equipment such as semiconductor devices and various displays, photolithographic techniques have conventionally been used for producing thin-film patterns, with a method being adopted of transferring a photoresist pattern onto a photosensitive material such as a photoresist applied on a substrate.

A common procedure of manufacturing a photomask is to manufacture a master mask by repeating reduced projection exposure after forming a reticle based on CAD data, and then mass-producing a working mask (copy).

A specific method of manufacturing a working mask that is generally used is to form, for example, a chromium evaporated film on a transparent substrate, such as quartz glass, transfer a reticle pattern using a photolithographic technique similar to the manufacturing process for a semiconductor device, which involves resist application, exposure, development, etching, and resist removal, and then pattern the chromium film (refer, for example, to Japanese Unexamined Patent Application, First Publication No. H09-73166). Other methods, such as electron-beam direct-writing are also in use.

As a result of actually manufacturing an electronic device using the completed photomask, the need may arise to correct the pattern of the photomask. Alternatively, as is the case with the semiconductor device known as an Application Specific Integrated Circuit (ASIC), semifinished products are prepared equipped with a number of circuit blocks having functions specified in advance, with wiring forming and corrections needed at the time of acquiring the customer specifications as in the case of manufacturing a semi-custom IC meeting the customer requirements by changing only the wiring.

Since, in the conventional method, a request for pattern formation, correction, alteration and the like involves redoing the entire photolithographic process starting from correcting the reticle and manufacturing a new photomask, considerable time and cost are expended.

SUMMARY

An advantage of some aspects of the invention is to provide a photomask that can quickly and easily meet demands for pattern formation, correction and alteration at a low cost and a method of manufacturing the same.

A method of manufacturing a photomask according to an aspect of the invention includes: ejecting droplets of a liquid containing a light-shielding material at predetermined positions on a substrate using a droplet ejection method, and drying the liquid to form a light-shielding pattern on the substrate, the light-shielding pattern containing the light-shielding material.

That is, in the aspect of the invention among a plurality of light-shielding patterns on a substrate, at least some of the light-shielding patterns are formed by a droplet ejection method, instead of all of the light-shielding patterns being formed by a conventional photolithographic method.

Specifically, droplets of a liquid consisting of metallic particles such as chromium distributed in a solvent are ejected as a light-shielding material onto a substrate using a droplet ejection method, such as an ink jet method. Then, the liquid is dried, making the light-shielding material remain on the substrate, to form a light-shielding pattern. A technique of ejecting liquid containing metallic particles by a droplet ejection method can be realized, being proposed in recent years as a metallic wiring formation technique.

By applying this method only to those locations where new pattern formation and pattern correction, alteration and the like are required, photolithography would become unnecessary at those portions, thereby enabling pattern formation, correction and alteration to be quickly and easily realized at low cost.

Moreover, when manufacturing ASICs mentioned above, even if conventional photolithography is employed in the phase of preparing the semi-finished product equipped with circuit blocks having a specified function, by using the above-mentioned droplet ejection method from the wiring formation step until completion, the work period from receiving the customer's specifications to product shipment can be shortened, and cost reduction also becomes possible.

It is preferable that the drying of the liquid include radiating a laser light onto the liquid.

While drying of the liquid can be achieved by heating the liquid with a given method, adopting a method of laser light irradiation enables localized heating of only the liquid, thereby allowing drying of the liquid in a short time without causing damage such as thermal deformation to the other portions of the substrate.

In the aforementioned drying step, it is acceptable to radiate the laser light onto the droplets of the liquid after being ejected onto the substrate. However, instead of this procedure, drying may be carried out simultaneously with droplets of the liquid landing on the substrate by ejecting the liquid onto an ejection target position on the substrate in a state of the ejection target position being irradiated with laser light.

With this method, spreading of the droplets is suppressed so that fine light-shielding patterns can be formed, and processing time from the ejection of the liquid to drying can be greatly reduced.

In addition, after drying the liquid by radiating laser light on the liquid ejected onto the substrate, there may be provided a process of additionally layering droplets on top of the dried liquid.

It is important that the light-shielding pattern of the photomask have sufficient light-shielding properties. However, when forming a light-shielding pattern by drying liquid droplets so that a light-shielding material remains on the substrate, depending on the circumstances it may not be possible to sufficiently ensure the film thickness of the light-shielding pattern, resulting in the light transmission not being sufficiently lowered. In this case, additionally layering droplets on dried droplets can build up the film thickness of the light-shielding pattern to obtain sufficient light-shielding properties. In this case, the number of layers can be set as desired.

In addition, when ejecting the liquid toward the ejection target position in a state of radiating laser light around the liquid ejection target position on the substrate, the ejection position of the droplets may being guided by the laser light so that the droplets of liquid land on the ejection target position on the substrate.

For example, when forming a fine light-shielding pattern with small diameter droplets, curvature of the flight paths of the droplets occurs due to airflow and the like, which may prevent the formation of a high-precision pattern at a desired location.

In this case, using a laser light guide can make the droplets reliably land at an ejection target position on the substrate, thereby allowing a high-precision pattern to be formed at a desired position. With guiding by laser light, the circumference of the ejection target position is irradiated with laser light. By forming the laser light flux into, for example, a band shape, then assuming a droplet, due to curvature of its flight path, makes contact with the laser light flux, the solvent in the portion of contact vaporizes. The droplet is then guided by the vaporization in a direction away from the laser light flux (as if the droplet were being repelled by the laser light flux) toward the ejection target position. Such is the phenomenon utilized by laser light guiding.

In addition, there may be provided a step of trimming a light-shielding pattern by emitting a laser light or an electron beam on a light-shielding pattern formed after the drying process.

By this method, a complete light-shielding pattern need not be formed solely by the droplet ejection step and the drying step. For example, after forming a large light-shielding pattern, a light-shielding pattern of the desired shape can be obtained by performing trimming such as cutting off the excess portions with a laser light or an electron beam.

Among a plurality of light-shielding patterns on a photomask, a light-shielding pattern belonging to the wiring region may be formed by the ejection step and the drying step.

Among a plurality of light-shielding patterns on a photomask, the portion to which the droplet ejection method is applied can be selected as desired. However, assuming a photomask for a semiconductor device such as an ASIC and the like, the functional block region has a high pattern density due to various memory and logic circuits, while the wiring region has a lower pattern density due to having comparatively more space. In the case of forming a pattern using the droplet ejection method, since it is difficult to attain a pattern with high fineness compared to a photolithographic method, it is preferable to apply it to wiring regions with a low pattern density.

A photomask according to an aspect of the invention is manufactured by the aforementioned method of manufacturing a photomask.

According to the photomask, it can quickly and easily meet demands for pattern correction and alteration and the like at a low cost.

A method of manufacturing an electronic device according to an aspect of the invention includes forming a pattern using the aforementioned photomask.

According to the method of manufacturing an electronic device, it can provide an electronic device capable of flexibly meeting demands for pattern correction and alteration and the like at a low cost and in a short delivery period.

DESCRIPTION OF EXEMPLARY EMBODIMENTS

First Embodiment

The first embodiment of the present invention shall be explained below with reference to the accompanying drawings.

Figure 1:
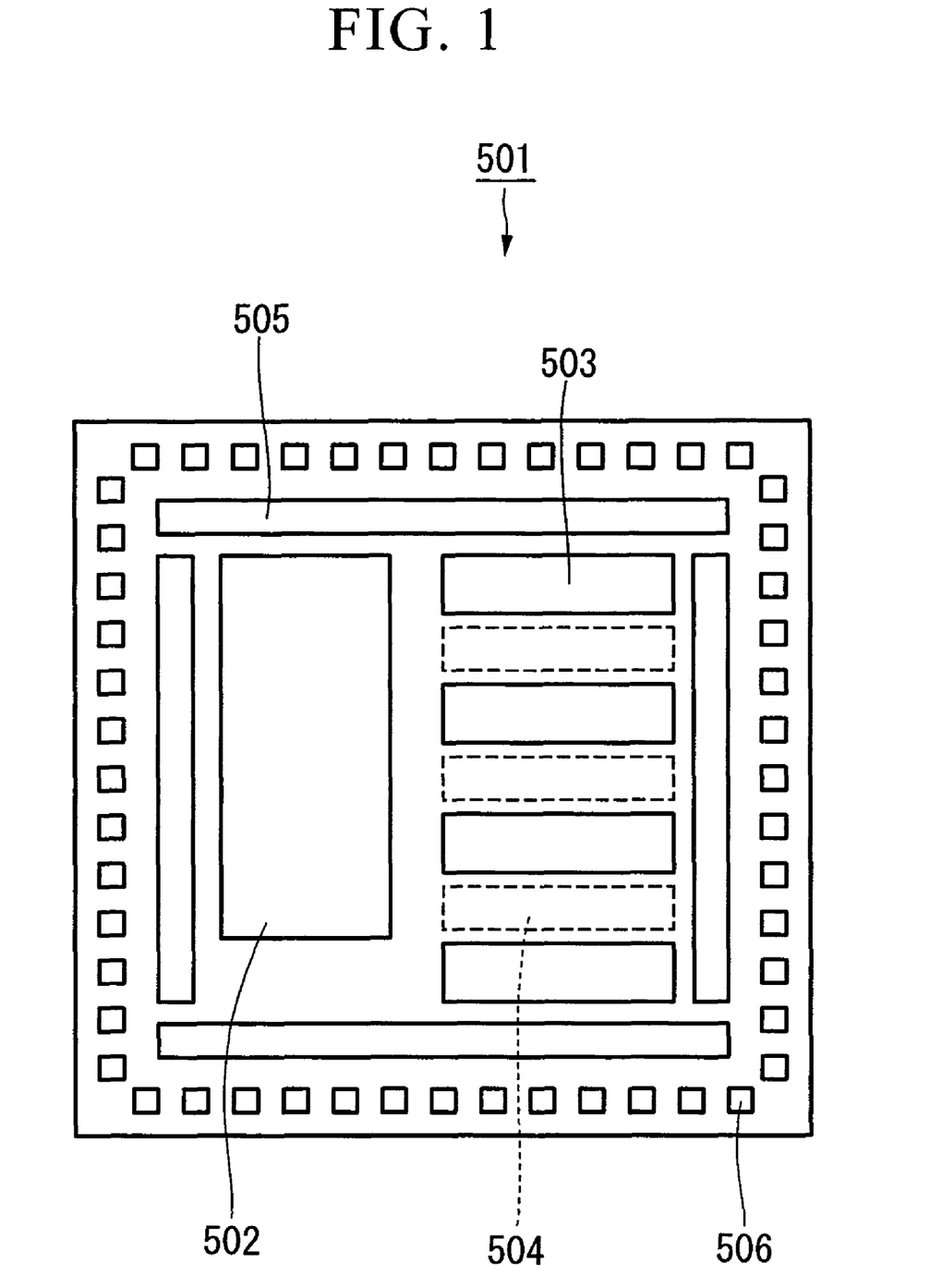
FIG. 1 is a plan view showing an example of the semiconductor device produced using the photomask of the present invention.

FIG. 1 is an outline lineblock diagram showing a semiconductor device produced using the photomask of the present embodiment. As an example of a semiconductor device, the present embodiment explains the creation of a driving LSI for a liquid crystal display, which is a kind of Application Specific Integrated Circuit (ASIC).

As shown in FIG. 1, a semiconductor device 501 of the present embodiment includes a memory portion 502 including ROM (read-only memory) and RAM (random-access memory), a plurality of logic circuit portions 503 that consist of a plurality of MOS transistors, a wiring portion 504 (wiring region) in which a number of wirings that connect the memory portion 502 and the plurality of logic circuit portions 503 are disposed, an input/output gate portion 505, and an external terminal 506. The light-shielding pattern density of the wiring portion 504 is low compared to the memory portion 502 and the logic circuit portions 503.

This semiconductor device is a kind of ASIC, in which a semi-finished product equipped with the memory portion 502 and the plurality of logic circuit portions 503 is prepared prior to obtaining the customer specifications. At the point of obtaining the customer specifications, a semi-custom IC meeting the customer requirements is then manufactured by forming only the wiring in the wiring portion 504. For example, supposing a photomask for patterning of an aluminum layer that is a layer of the wiring layer, in the present embodiment the light-shielding pattern of the portion of the memory portion 502 and the plurality of logic circuit portions 503 is formed in advance by a photolithographic method, with only the light-shielding pattern in the wiring portion 504 being formed using a droplet ejection method. Moreover, in this embodiment, a photomask used for a reduced projection exposure apparatus with a magnification of 1/10 is produced. Therefore, the width of the light-shielding pattern corresponding to wiring with a 1 micrometer width on the semiconductor device is 10 micrometers. These dimensions sufficiently allow drawing with existing inkjet technology.

The method of forming the light-shielding pattern of the present embodiment is explained below with reference to FIGS. 2 to 4.

Figure 2:
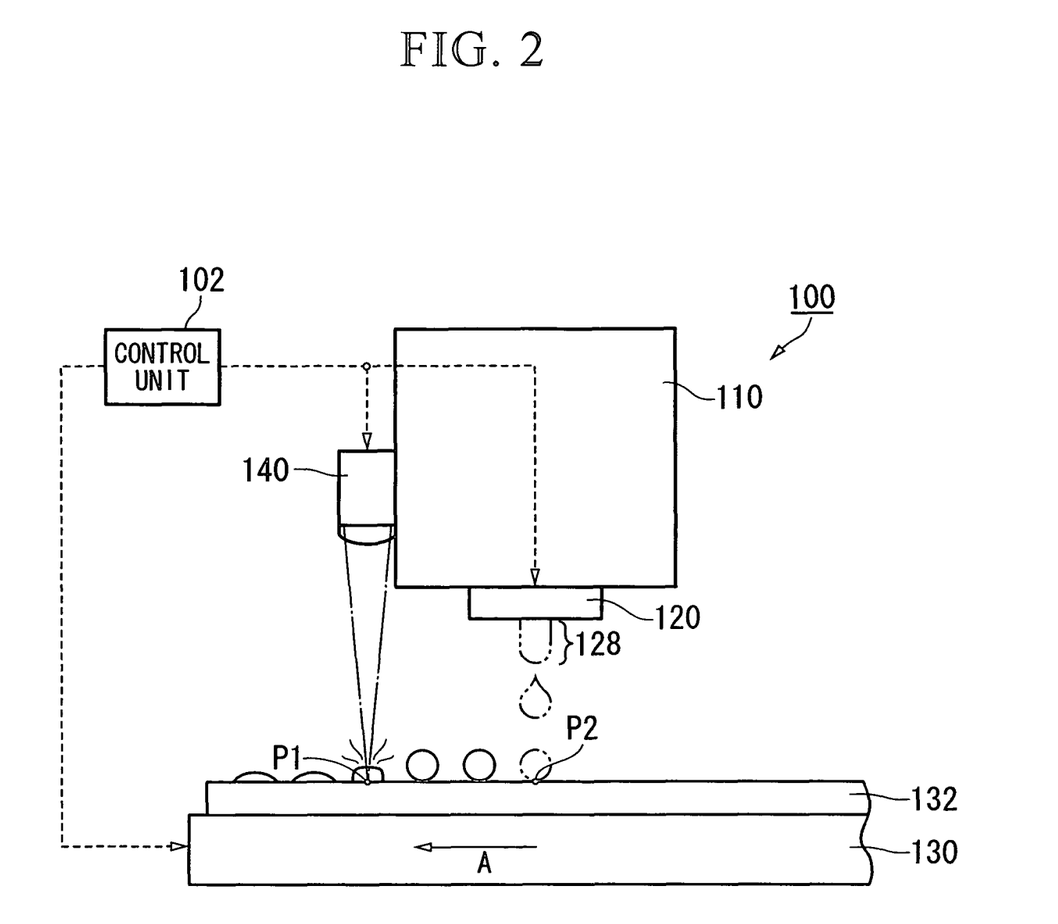
FIG. 2 is a process chart showing the pattern formation apparatus and pattern formation method of the first embodiment of the present invention.
Figure 3:
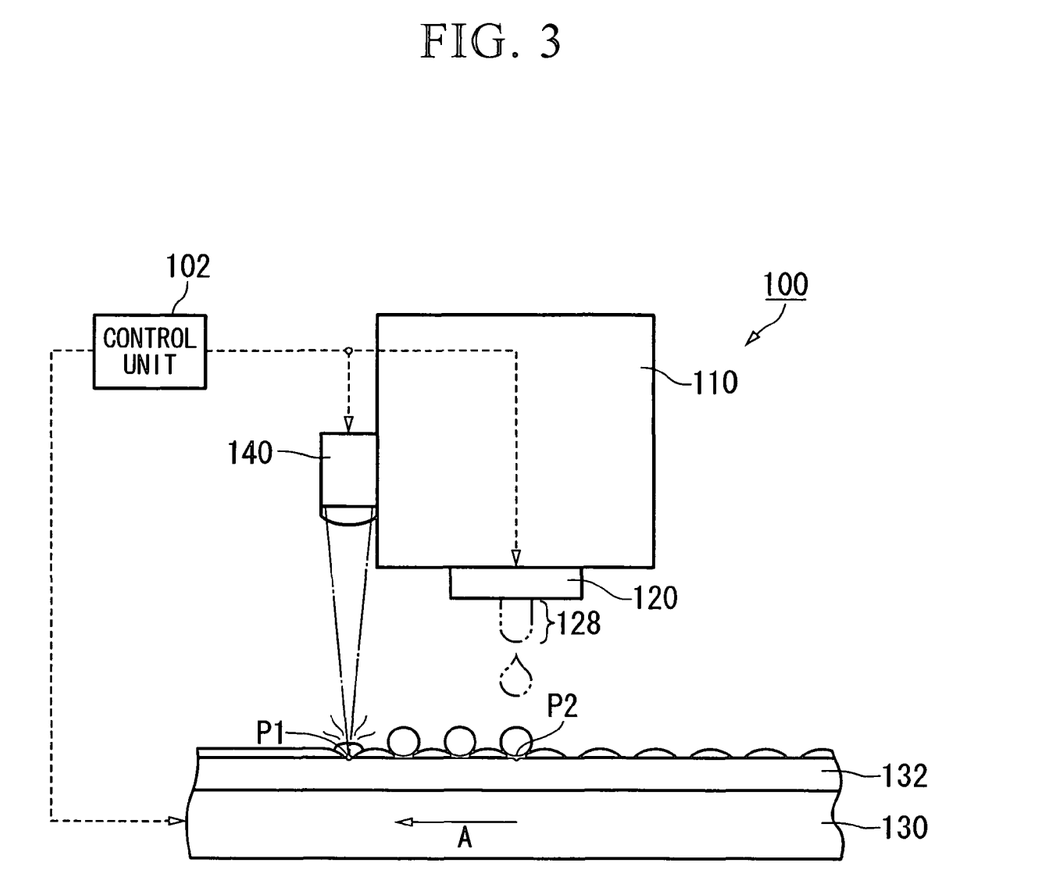
FIG. 3 is a continuation of the same process chart.
Figure 4:
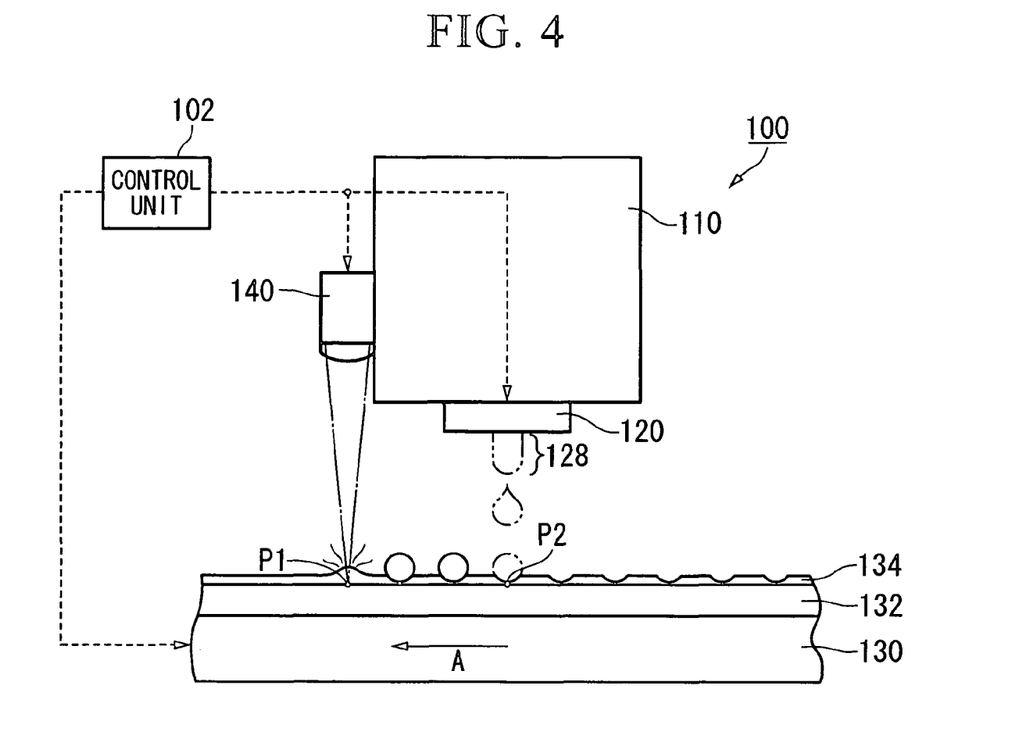
FIG. 4 is a continuation of the same process chart.

FIGS. 2 to 4 are process charts showing a pattern formation apparatus (droplet ejection apparatus) 100 for forming a light-shielding pattern along with the steps of forming a light-shielding pattern.

As shown in FIG. 2, a control unit 102 outputs drive signals to an ejection head 120, a substrate carriage 130, a laser radiation portion 140 (and light source) and an actuator (not shown), thereby controlling the entire system. The control unit 102 includes a CPU, a timer clock, and memory for storing a information of the light-shielding patterns. A solution with a viscosity of around 20 mPa·s, consisting of particles such as chromium as a light-shielding material distributed in an organic solvent such as $C_{14}H_{30}$ (n-tetradecane), is stored in a solution tank 110. The ejection head 120 is an electromechanical type employing a piezoelectric element. The ejection head 120, under the control of the control unit 102, is fed the solution from the solution tank 110 and ejects the solution as droplets.

Discharge technology of a droplet ejection method includes a charge control method, a pressure oscillation method, an electromechanical method, an electrothermal conversion method, and an electrostatic attraction method. In the charge control method, ink is ejected from a nozzle 128 by applying a charge to a material with a charge electrode and controlling the flying direction of the material with a deflection electrode.

In the pressure oscillation method, material is ejected to the nozzle tip side by impressing an extra high pressure of 30 kg/cm² on the material. When a control voltage is not applied, the material is ejected straight out of the nozzle 128, while if a control voltage is applied, electrostatic repulsion occurs between the materials, causing the material to disperse to prevent its ejection from the nozzle 128. The electromechanical method utilizes the characteristic of a piezoelectric element to deform in response to a pulsed electrical signal. Pressure from deformation of the piezoelectric element is applied via a flexible material to a space that stores material, thereby pushing the material out of the space to be ejected from the nozzle 128. As a droplet ejection method, it is possible to adopt a bubble (thermal) method of ejecting a liquid material via bubbles generated by heating the liquid material. However, droplet ejection by the piezoelectric method has the advantage of not heating the material, and therefore hardly affects the constitution of the material.

Moreover, as fine particles that form the light-shielding material of the photomask, chromium can be suitably used. In addition, silver, copper, gold, nickel, manganese, etc. can be used. The particles of the light-shielding material may be used by being coated with an organic substance on the surface thereof in order to improve dispersibility. A polymer that induces steric hindrance and electrostatic repulsion may be cited as a coating material for coating the surface of the particles. In addition, the particle diameter is preferably between 5 nm and 0.1 micrometer inclusive. A diameter of greater than 0.1 micrometer can easily cause clogging of the nozzle, thereby hindering ejection by the ejection head 120. When the diameter is smaller than 5 nm, the volume ratio of the coating agent with respect to the particles increases, and hence the percentage of organic substance in the obtained film will be excessive.

The dispersion medium is not specifically limited as long as it can disperse the above-described particles without generating cohesion. For example, in addition to n-tetradecane, alcohol, such as methanol, ethanol, propanol, and butanol; hydrocarbon-based compounds such as n-heptane, n-octane, Deccan, toluene, xylene, cymene, durene, indene, dipentene, tetrahydronaphthalene, decahydronaphthalene, and cyclohexylbenzene; ether-based compounds such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1, 2-dimethoxy ethane, bis (2-methoxyethyl) ether, and p-Dioxane; and polar compounds such as propylene carbonate, gamma-butyrolactone, N-methyl-2-pyrrolidone, dimethylformamide, dimethyl sulfoxide, and cyclohexanone. Among these mediums, water, alcohols, hydrocarbon-based compounds, and ether-based compounds are preferable in terms of ease of application to a droplet ejection method. Hydrocarbon-based compounds are particularly preferably dispersion mediums. These dispersion mediums can be used singly or in blends of two or more kinds.

A substrate carriage 130 relatively displaces (conveys) a substrate 132 in a horizontal direction relative to the ejection head 120 under the control of the control unit 102. When doing so, the substrate carriage 130 conveys the substrate 132 in accordance with the information of the light-shielding pattern stored in the memory contained in the control unit 102.

Thereby, a light-shielding pattern is drawn on the substrate 132 by droplets ejected from the ejection head 120. In the present embodiment, a information of a linear light-shielding pattern which extends parallel with direction A in the drawing is stored in the memory of the control unit 102, and the conveying direction of the substrate 132 shall be the A direction. In the present embodiment, a suitable transparent substrate, such as quartz glass, is used as the substrate 132 for the photomask.

The laser radiation portion 140 is formed on the side of the solution tank 110. The laser radiation portion 140 emits a laser of two intensities (high or low) according to the drive signal output from the control unit 102, and converges the laser light on a horizontal surface including the top face of the substrate 132. In greater detail, the laser light is converged so that a straight line connecting the light converging position P1 and a landing position P2 of droplets ejected from the ejection head 120 is parallel with the conveying direction (direction A in this example) of the substrate 132. The droplets ejected onto the substrate 132 pass the light converging position P1 by the conveying in direction A of the substrate 132. Among the laser light emitted from the laser radiation portion 140, laser light with a low-level intensity performs the role of promoting drying of the droplets ejected onto the substrate 132 and fixing the droplets onto the application position on the substrate 132. On the other hand, the high-level intensity laser light performs the role of baking the chromium particle group included in the droplets.

Next, the patterning action of the light-shielding pattern in the pattern formation apparatus 100 of the above-mentioned constitution shall be explained. This description is for the example of patterning a straight line extending parallel with direction A by conveying the substrate 132 five times. To begin with, in the first conveyance, the control unit 102 commences the ejection of droplets from the ejection head 120, with the droplets thereafter being ejected at a fixed interval. Next, the control unit 102 has the substrate carriage 130 convey the substrate 132 in direction A, having the droplets ejected from the ejection head 120 land on the substrate 132 so as to draw a light-shielding pattern. At this time, the substrate carriage 130 conveys the substrate 132 at a rate so that the droplets continuously ejected over time land at positions spaced apart from each other. As a result, the drops are applied on the substrate 132 in a state of being separated.

Applying the droplets to be thus spaced apart is done for the following reason. Generally, when applying droplets so that a plurality of droplets are continuous, the continuum of the droplets deforms to approximate a sphere due to the action of surface tension, causing local movement of droplets. Therefore, in this embodiment the droplets are applied so as to be mutually spaced apart, with each drop being fixed to its application position. The droplets thus applied so as to be mutually spaced apart are successively conveyed to the light converging position P1 of the laser light radiated from the laser radiation portion 140 as the substrate 132 is conveyed by the substrate carriage 130.

When a droplet arrives at the converging location P1, the control unit 102 has low-intensity laser light radiated from the laser radiation portion 140, making the laser light converge on the top face of the substrate 132. The emission timing of this low-intensity laser light is determined in accordance with the distance between the ejection head 120 and the substrate 132, the ejection speed of the droplets, the drive signal output by the ejection head 120, and the distance between the landing position P2 and the light converging position P1.

The droplets on the substrate 132 are heated by laser light while passing the converging position P1, which causes the organic solvent contained in the droplets to evaporate. The substrate carriage 130 conveys the substrate 132 at a speed so that while the droplets pass the converging position P1, the droplets dry until some of the organic solvent remains.

This conveying speed can be set in accordance with the amount of organic solution contained in the droplets and the laser light intensity, and so on. Irradiation with this kind of laser light discretely fixes the chromium particles contained in the droplets to the substrate 132. If the droplets are not sufficiently dried in the first conveyance, the process of radiating laser light on the droplets may be performed again. In this way, a portion of the droplets is evaporated until a portion of solvent contained in the droplets remains. In the present specification, "drying" thus refers to thickening the droplets so that the light-shielding material (in this example, chromium particles) does not shift from the landing position.

Figure 5:
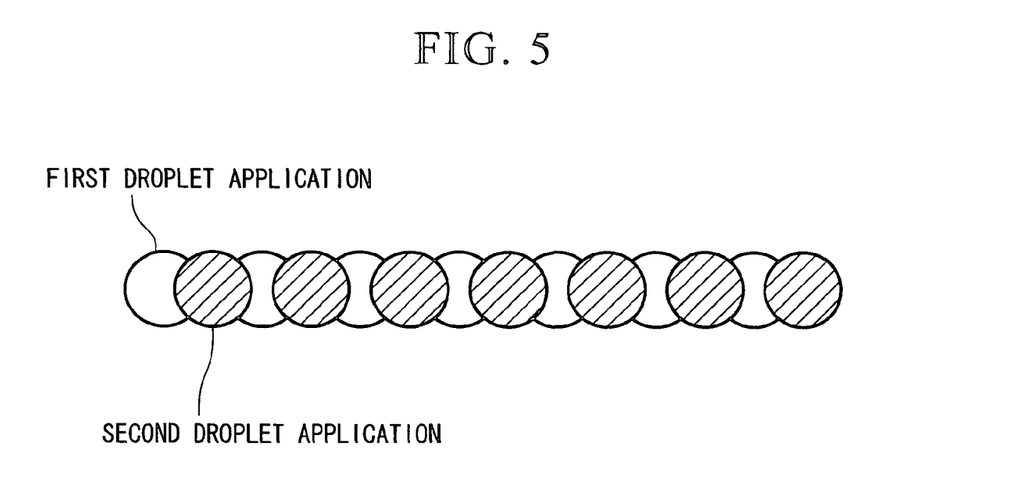
FIG. 5 is an enlarged plan view of the same light-shielding pattern.

FIG. 3 is a drawing showing the appearance of the second conveyance. As shown in FIG. 3 and FIG. 5, the substrate carriage 130 conveys the substrate 132 so that the droplets ejected from the ejection head 120 land at positions to fill the gaps between the droplets applied in the first conveyance. Here, if a droplet is made to land in this way, the newly applied droplets and the droplets applied by the first conveyance will partially touch, but the droplets applied in the first conveyance will have been already dried by the laser light. For this reason, there is no risk of the newly applied droplets merging with the droplets applied in the first conveyance, causing local movement of the droplets. The newly applied droplets are then successively conveyed to the converging position P1 of the laser light to be heated and dried by the laser light. Third and fourth conveyances are thereafter similarly performed in the pattern formation apparatus 100, with the droplets being dried and chromium particles contained in the solution being layered in accordance with the light-shielding pattern.

FIG. 4 is a drawing showing the appearance of the fifth conveyance. In the fifth conveyance, unlike the processing in the aforementioned first through fourth conveyances, processing related to baking the chromium particle group is performed instead of processing to dry the droplets. The control unit 102 switches the laser intensity of the laser radiation portion 140 from the low level to the high level. Next, the control unit 102 commences the ejection of droplets by the ejection head 120, with the droplets thereafter being ejected at a fixed interval. In addition, the substrate carriage 130 conveys the substrate 132 so that droplets ejected from the ejection head 120 land at gaps between the drops dried in the fourth conveyance. Thereby, the ejected droplets are applied on the substrate 132 so as to be mutually spaced apart.

The droplets applied in this way are conveyed to the converging position P1 of the laser light along with the droplets dried in the previous conveyances (chromium particle group 134). The laser radiation portion 140 radiates high intensity laser light toward the newly applied droplets and the chromium particle group 134, heating the chromium particle group 134 to about 300° C. and baking the chromium particle group 134. Thereby, the chromium particles contained in the chromium particle group 134 are sufficiently joined and the light-shielding pattern is completed.

By applying the droplet ejection method only to those portions that require fresh pattern formation, such as to only the light-shielding pattern in the wiring portion 504 in an ASIC as in the example of the present embodiment, a photolithographic method would be unnecessary for that portion, thereby enabling pattern formation to be quickly and easily realized at low cost. In addition, when manufacturing an ASIC and the like, even if a conventional photolithographic method is employed in the phase of preparing the semi-finished product equipped with circuit blocks having a specified function, by using the above-mentioned droplet ejection method from the wiring formation step until completion, the work period from receiving the customer's specifications to product shipment can be shortened, and cost reduction also becomes possible.

In addition, with the pattern formation apparatus 100 of the present embodiment, radiating laser light on a droplet dries the droplet directly after application. Thereby, the droplet can be dried and fixed on the substrate 132 without the chromium particles contained in the droplet shifting from the application position.

Moreover, according to the method of the present embodiment, the applied droplets are forcibly dried by laser light. Accordingly, compared to the conventional patterning technique involving repetition of a droplet application process and a natural drying process for the applied droplets, the processing time can be greatly shortened. Compared to a method of heating the entire substrate, since only the chromium particle group 134 portion on the substrate 132 is locally heated by laser light irradiation, thermal deformation hardly occurs in the substrate 132. The possibility of the alignment shifting and wire disconnection occurring is therefore low. Moreover, since only the chromium particle group 134 is locally heated instead of the entire substrate 132, compared to methods that heat the entire substrate 132, energy consumption can be substantially reduced.

Second Embodiment

The second embodiment of the present invention shall be explained below with reference to the accompanying drawings.

Figure 6:
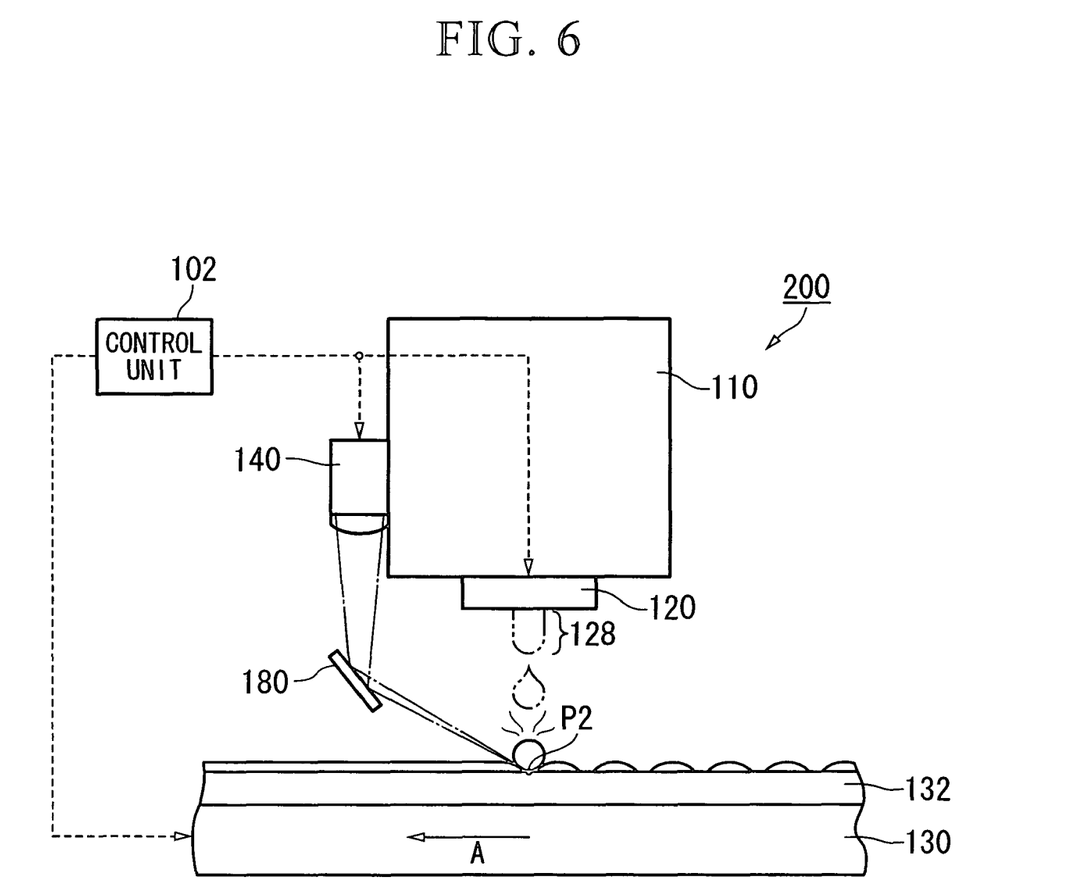
FIG. 6 is a diagram showing the pattern formation apparatus of the second embodiment of the present invention.

In the first embodiment, a description was given for the pattern formation apparatus 100 that applied droplets containing a light-shielding material, and then irradiated the droplets with a low-intensity laser light to dry the droplets and form a light-shielding pattern. In contrast, the second embodiment describes a pattern formation apparatus that dries droplets by irradiating them with laser light approximately simultaneously with the application of the droplets. In the pattern formation apparatus of the present embodiment, the same reference numerals are used to designate elements identical to those in the first embodiment.

FIG. 6 is a lineblock diagram of the pattern formation apparatus 200 in connection with the second embodiment.

As shown in FIG. 6, compared with the pattern formation apparatus 100 of the first embodiment, a reflector 180 is newly added to the optical path of laser light in the pattern formation apparatus 200. This reflector 180 reflects laser light emitted from the laser radiation portion 140 so that it converges on the top surface of the substrate 132, at the landing position P2 of the droplets ejected from the ejection head 120. If the substrate 132 is deemed to have been hardly conveyed during a period from the ejection of a droplet from the ejection head 120 to its landing, the reflector 180 converges the laser light at a point on the top surface of the substrate 132 directly below the nozzle 128 provided in the ejection head 120.

By this constitution, laser light is converged by the reflector 180 at the landing position P2 of the droplets during patterning. Thereby, droplets ejected from the ejection head 120 are heated by the laser light nearly at the same time that they land, and so are dried at nearly the same time that they land. As a result, the chromium particles contained in the droplets can be fixed to the application position (landing position P2) similarly to the first embodiment described above. That is, since in the present constitution a droplets is dried at the same time it lands on the substrate by ejecting the droplet onto the ejection target position on the substrate in the state of laser light being radiated on the ejection target position of the droplet, spreading of the droplet is suppressed. This enables the formation of a fine light-shielding pattern and greatly shortens the processing time from ejection of the droplets to their drying.

Although this embodiment showed the example of using the reflector 180 to converge reflected light (laser light) on the landing position P2, the present invention is not limited thereto. For example, the constitution may be adapted to provide the laser radiation portion 140 at a position so that direct light (laser light) emitted from the laser radiation portion 140 is converged at the landing position P2.

Third Embodiment

The third embodiment of the present invention shall be explained below with reference to the accompanying drawings.

The first and second embodiments described a pattern formation apparatus that produced a light-shielding pattern by radiating laser light on droplets containing a light-shielding material and drying the droplets. In contrast, the third embodiment describes a pattern formation apparatus that guides the path of the droplets by laser light irradiation.

Figure 7:
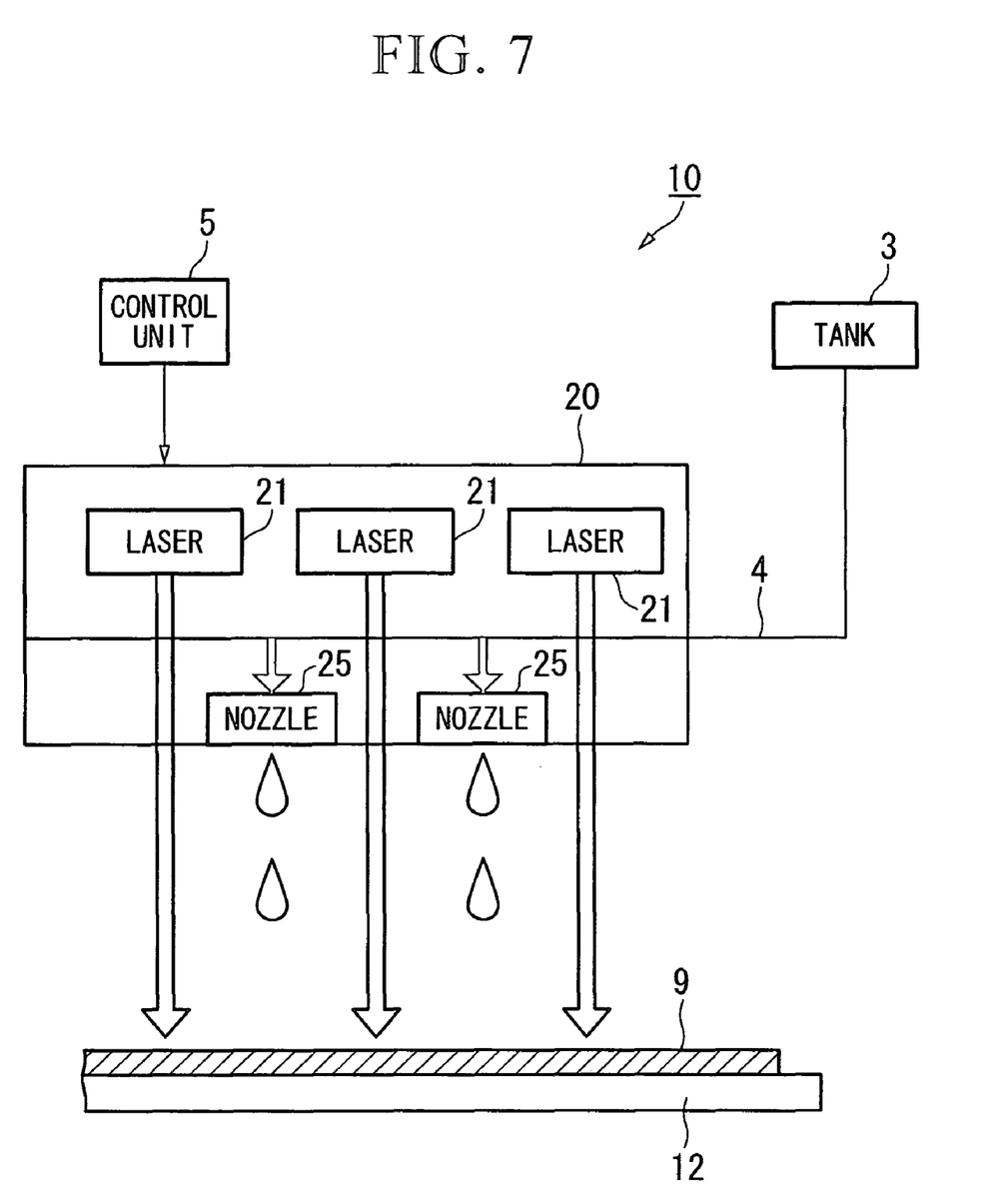
FIG. 7 is a diagram showing the pattern formation apparatus of the third embodiment of the present invention.

FIG. 7 is a lineblock diagram of the pattern formation apparatus 10. A control unit 5 controls the operation of each part of the pattern formation apparatus 10.

A solution tank 3 stores a solution consisting of chromium particles distributed in n-tetradecane in the form of a liquid, similarly to the first and second embodiments. The solution held in the solution tank is supplied to an ejection portion 25 through a pipe 4, and then ejected from the nozzle of the ejection portion 25. The pattern formation apparatus 10 according to the present embodiment is an apparatus that ejects the chromium particle dispersion liquid onto a substrate 9 as droplets, then by evaporating the dispersion medium present on the substrate 9, makes the chromium remain on the substrate 9 to thereby form a light-shielding pattern.

The ejection portion 25 is a member that ejects the chromium particle dispersion liquid as droplets onto the substrate 9. The actual head portion 20 is equipped with a plurality of ejection portions 25, and drive signals are supplied to each ejection portion 25 by the control unit 5. Moreover, a laser radiation portion 21 radiates laser light to the substrate 9. The actual head portion 20 is provided with a plurality of laser radiation portions 21 (a total of six in the present embodiment). The laser radiation portions 21 are disposed to as to enclose the ejection portions 25.

Figure 8:
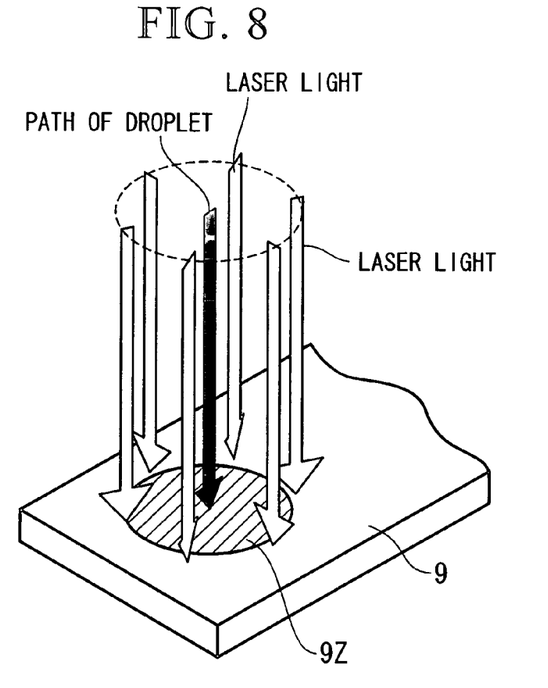
FIG. 8 is a diagram showing the principle of laser guiding with the same pattern formation apparatus.

FIG. 8 illustrates the progress direction (trajectory) of a droplet and laser light when performing ejection of a droplet and radiation of laser light from such a head portion 20. FIG. 8 shows the path of a droplet and the laser light, focusing on one ejection portion 25 and laser radiation portions 21 arranged around the ejection portion 25.

Ignoring clogging of the nozzle and the effects of air resistance, as shown in FIG. 8, droplets ejected from the nozzle fall (land) on the target portion of the substrate 9 by kinetic momentum that is imparted.

Here, an ejection target position 9Z is adjusted in advance by relative positional adjustment of the head portion 20 and a stage 12. In the present embodiment, the ejection target position 9Z is assumed to be located directly under the nozzle.

Figure 9:
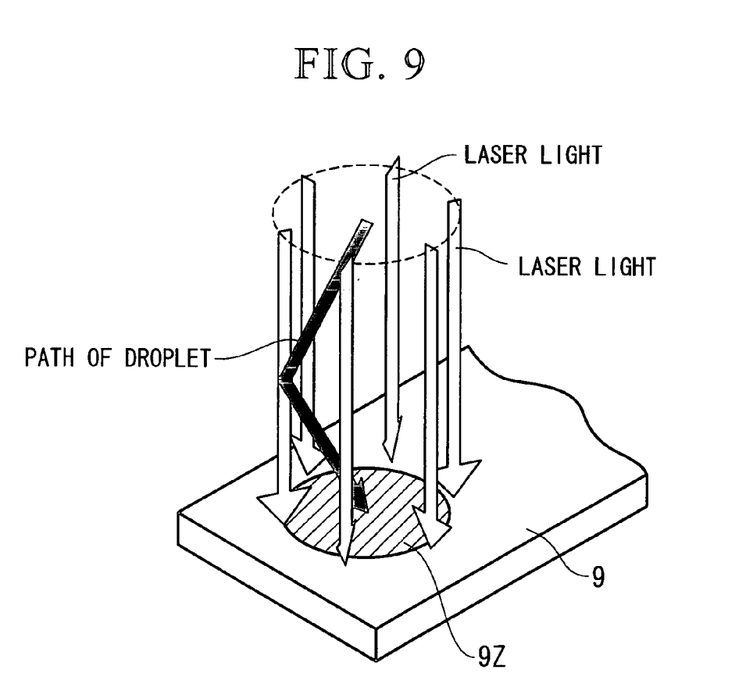
FIG. 9 is a diagram showing the principle of laser guiding with the same pattern formation apparatus.

Meanwhile, FIG. 9 shows the case of the path of a droplet being bent by nozzle clogging and the effects of air resistance.

As shown in FIG. 9, the droplet strays in a direction different from the ejection target position 9Z on the substrate 9, with the droplet colliding with one of the laser lights. Due to the collision, the droplet changes course to the direction of repulsion. Thereby, the droplet safely reaches the ejection target position 9Z on the substrate 9. In addition, although FIG. 9 illustrates the case of a droplet colliding once with a laser light, even after repeated collisions a droplet will eventually reach the ejection target position 9Z.

The phenomenon of a droplet colliding with a laser light and being rebounded by the laser light is based on a portion of the droplet being vaporized by the light energy of the laser light. That is, if the droplet approaches a laser light, the portion of the droplet near the laser light experiences a rise in temperature, causing that portion to vaporize.

Due to the energy generated from vaporization, the droplet that approached the laser light undergoes a change in course so as to move away from the laser light. The inventors thus focused their attention on the point of a droplet moving (falling) through a region surrounded by laser lights and eventually landing on the ejection target position 9Z if the laser lights are radiated in the vicinity (circumferential position) of the ejection target position 9Z.

Here, in order to prevent droplets from passing between adjacent laser lights, the intervals of radiating laser light may be determined taking into consideration the radius of a droplet and the beam diameter of the laser light. The phenomenon of a droplet being rebounded by laser light can be analyzed based on the energy generated during vaporization and the kinetic momentum of a droplet. For this reason, it is preferable to conduct simulation experiments beforehand to determine the preferred conditions for a droplet to be repelled by laser light.

The above is the principle of operation of the pattern formation apparatus 10 of the present embodiment. In this way, with the pattern formation apparatus 10, even if the progression direction of a droplet veers from the direction of the ejection target position 9Z due to clogging of the ejection head 25 or the effects of air resistance, the droplet will undergo a change in course and arrive (land) at the original ejection target position 9Z by being rebounded by the surrounding laser lights.

As described above, the pattern formation apparatus 10 of the present embodiment can make droplets of a chromium particle dispersion liquid land on a substrate with a high degree of positional accuracy. As a result, a photomask can be manufactured with excellent dimensional accuracy and positional accuracy of its light-shielding pattern.

Fourth Embodiment

The fourth embodiment of the present invention shall be explained below with reference to the accompanying drawings.

The present embodiment describes a pattern formation apparatus suitable for layering a plurality of droplets ejected on a substrate by laser light radiation to form a thick film light-shielding pattern.

Figure 10:
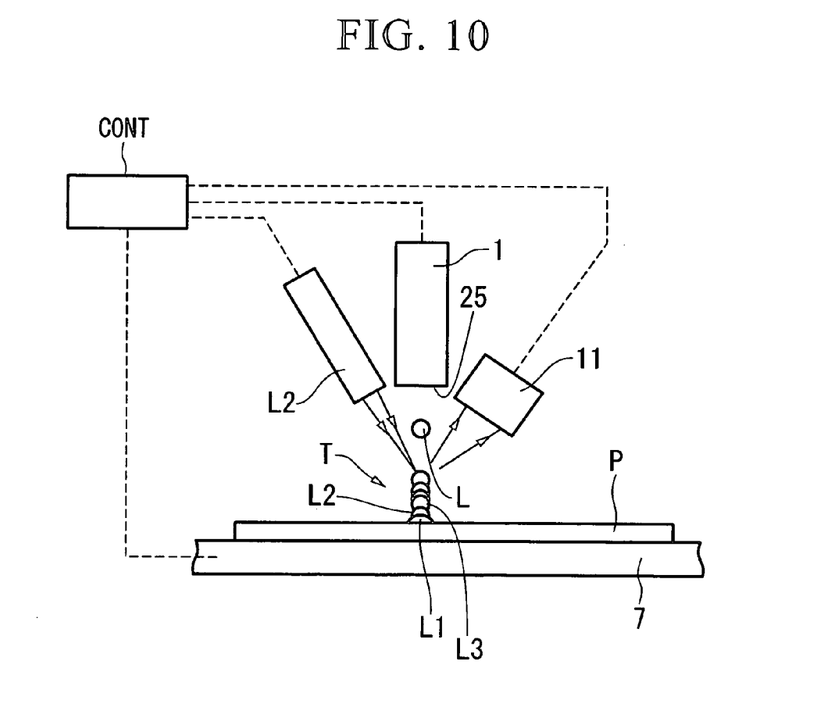
FIG. 10 is a drawing showing the pattern formation apparatus of the fourth embodiment of the present invention.

FIG. 10 is a drawing showing the outline constitution of the pattern formation apparatus.

The pattern formation apparatus is equipped with a droplet ejection head 1, a control unit CONT and a stage 7. The stage 7 supports a substrate P on which a chromium particle dispersion liquid is applied by the pattern formation apparatus. The droplet ejection head 1 is a multi-nozzle type droplet ejection head equipped with a plurality of nozzles. The plurality of ejection nozzles are provided at a fixed spacing on the bottom surface of the droplet ejection head 1. The aforementioned dispersion liquid containing chromium particles is ejected from the dispersion nozzles of the droplet ejection head 1 onto the substrate P supported by the stage 7.

Moreover, in this embodiment, as shown in FIG. 10, a photodetector 11 is arranged on one side of the scanning direction of the droplet ejection head 1, and a laser radiation portion 12 is formed on the other side of the scanning direction of the droplet ejection head 1 for each of the plurality of nozzles. The photodetector 11 emits a detection light on the position directly under the droplet ejection head 1, and by detecting the light reflected therefrom, detects the top position of the layered droplets. The detection result is then output to the control unit CONT. A method of examining the spread of reflected light or a method examining the distribution of diffracted light may be employed for detecting the top position of the droplets. Moreover, by calculating in advance the relationship between the number of ejected droplets and the top position of accumulated droplets, it is possible to determine the top position according to the number of ejected droplets. In this case, the photodetector may be omitted.

Under the control of the control unit CONT, the laser radiation portion 12 emits laser light by diagonal incidence below the droplet ejection head 1, with an optical element (not shown) that converges the laser light provided therein. The control unit CONT is constituted to be able to adjust the focal position of the laser light, i.e., the light energy imparting position, by adjusting the position of the optical elements. In the present embodiment, in order to effectively impart light energy to a droplet with a minute diameter, a beam profile is adopted in which the light intensity becomes high at the center of the beam.

A droplet application method using the above-mentioned pattern formation apparatus is explained below.

First, a substrate P is moved to the position to form a light-shielding pattern with respect to the droplet ejection head 1. The first droplet L is ejected from a nozzle 25 of a head 1 and applied to the substrate P. Although the applied droplet L (referred to as L1) is initially in a round state due to surface tension, when the surface of the substrate P is made affinity, after the passage of a given length of time, or time depending on the surface energy of the droplet (for example, about 20 microseconds), the droplet L1 spreads until reaching a contact angle depending on the surface energy of the substrate P and the droplet surface energy. Since this time is known, the control unit CONT radiates laser light (for example 1.0 W/mm$^2$ for 1 millisecond) from the laser radiation portion 12 before the droplet L1 spreads on the surface of the substrate P. The droplet L1 that is imparted with light energy by the radiation of the laser light dries or bakes. Since the laser light is radiated onto this droplet L1 so that the next drop (second drop) may be stacked thereon, it need not necessarily be baked, and may just receive the energy sufficient for the surface to dry.

When the first droplet L1 has been fixed, the control unit CONT ejects the second droplet L2 from the droplet ejection head 1 onto the droplet L1, and after the droplet L2 has been applied to the droplet L1, immediately irradiates it with laser light. The position irradiated with the laser light (converging position) at this time is higher than when performing laser irradiation on the droplet L1. Therefore, the control unit CONT moves the optical element of the laser radiation portion 12 based on the top position of the droplet L2 detected by the photodetector 11, and alters the focal position of the laser light (place where light energy is imparted) to the top position of the droplet L2.

Moreover, although the droplet L1 was applied on the substrate P, since the droplet L2 is applied on the droplet L1, the reflectance at the laser irradiation points differ. Therefore, if light energy equivalent to the droplet L1 is applied to the droplet L2, the heat added to the droplet L2 may be great, causing it to evaporate. Therefore, the control unit CONT sets the amount of light energy to be applied according to the material of the landing position of the droplet, so as to impart less light energy (for example 0.5 W/mm$^2$ per millisecond) to the second droplet onward than for the first droplet L1.

In this way, the droplet L2 can be applied and fixed to the droplet L1 in a stacked state by imparting light energy to the droplet L2 to dry or bake it.

By successively repeating the same procedure to apply and then dry or bake droplets L3 onward on top of the droplet L2, and moreover repeating this operation in the conveying direction, a light-shielding pattern of several hundred microns in height can be formed on the substrate P.

Although it is important for the light-shielding pattern of a photomask to exhibit sufficient light-shielding performance, when forming a light-shielding pattern, depending on the circumstances it may not be possible to sufficiently ensure the film thickness of the light-shielding pattern, resulting in the light transmission not being sufficiently lowered. In this case, additionally layering droplets on dried droplets as in the present embodiment can build up the film thickness of the light-shielding pattern to obtain sufficient light-shielding properties.

Fifth Embodiment

The fifth embodiment of the present invention shall be explained below with reference to the accompanying drawings.

Whereas the first through fourth embodiments described the setup of drawing a light-shielding pattern from scratch using a droplet ejection method, the present embodiment describes an example of forming a correction pattern using a droplet ejection method on a partially completed light-shielding pattern.

Figure 11A:
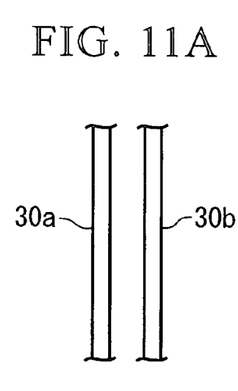
FIGS. 11A, 11B, 11C, and 11D are drawings showing the pattern formation method of the fifth embodiment of the present invention.

In the present embodiment, as shown in FIG. 11A, prior to forming a light-shielding pattern using a droplet ejection method, linear light-shielding patterns 30a, 30b are formed in advance. These light-shielding patterns 30a, 30b are formed by, for example, a photolithographic method simultaneously with the light-shielding patterns other than the wiring portion 504, such as the memory portion 502 and the logic circuit pattern 503.

Figure 11B:
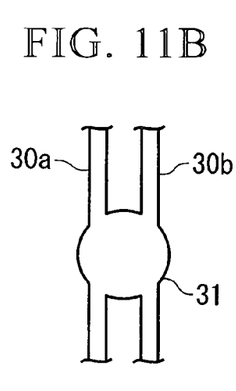

Next, as shown in FIG. 11B, droplets of a chromium particle dispersion liquid are ejected on a pattern correction location of a substrate using an ink jet method, similarly to the first through fourth embodiments. Here, between the light-shielding patterns 30a and 30b, a droplet accumulation portion 31 is formed. This droplet accumulation portion 31 may be formed with one droplet or a plurality of droplets, being suitably determined according to the size of the pattern correction location.

Figure 11C:
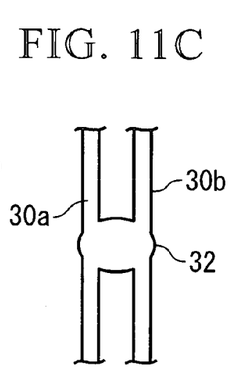

Next, as shown in FIG. 11C, droplets of the chromium particle dispersion liquid ejected on the substrate are dried and baked. In this case, as stated in the first embodiment, the drying and baking may be performed with laser light, or by heating the substrate. Or as the second embodiment described, drying and baking may be performed simultaneously with landing of the droplets by radiating laser light in advance on the ejection target position. Whichever method is used, a droplet accumulation portion 32 after drying, baking of the droplets is smaller that the droplet accumulation portion 31 before drying shown in FIG. 11B.

Figure 11D:
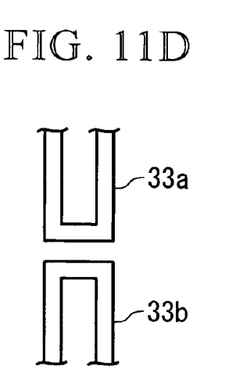

Next, as shown in FIG. 11D, trimming is performed on the droplet accumulation portion 32 to form the desired light-shielding patterns 33a, 33b. Specifically, by emitting a high-intensity laser light, the edge portions of the round droplet accumulation portion 32 are cut into a linear shape, and the center portion of the droplet accumulation portion 32 is linearly detached. Thereby, two U-shaped light-shielding patterns 33a, 33b are formed based on the two linear light-shielding patterns 30a, 30b.

According to the present embodiment, a desired light-shielding pattern need not be formed only by a droplet ejection step and drying step. For example, after forming a large light-shielding pattern (droplet accumulation portion 32 of FIG. 11C) the light-shielding patterns 33a, 33b of the desired shape can be obtained by trimming such as removing the excess portions by laser light.

In the aforementioned embodiment, the drying step of FIG. 11C and the trimming step of FIG. 11D were performed separately, but since radiating high-intensity laser light before drying a droplet causes the droplet to flow and escape from that portion, the drying step and the trimming step can also be performed simultaneously.

Moreover, although laser light was used for trimming in the above-mentioned embodiment, an electron beam may be used instead of laser light. More accurate trimming (removal) is possible with an electron beam.

Electronic Device

By executing a plurality of photolithographic process (resist application, exposure, development, etching, resist removal) using the photomask described in the above embodiments, a driving LSI for a liquid crystal display such as shown in FIG. 1 can be created.

Figure 12:
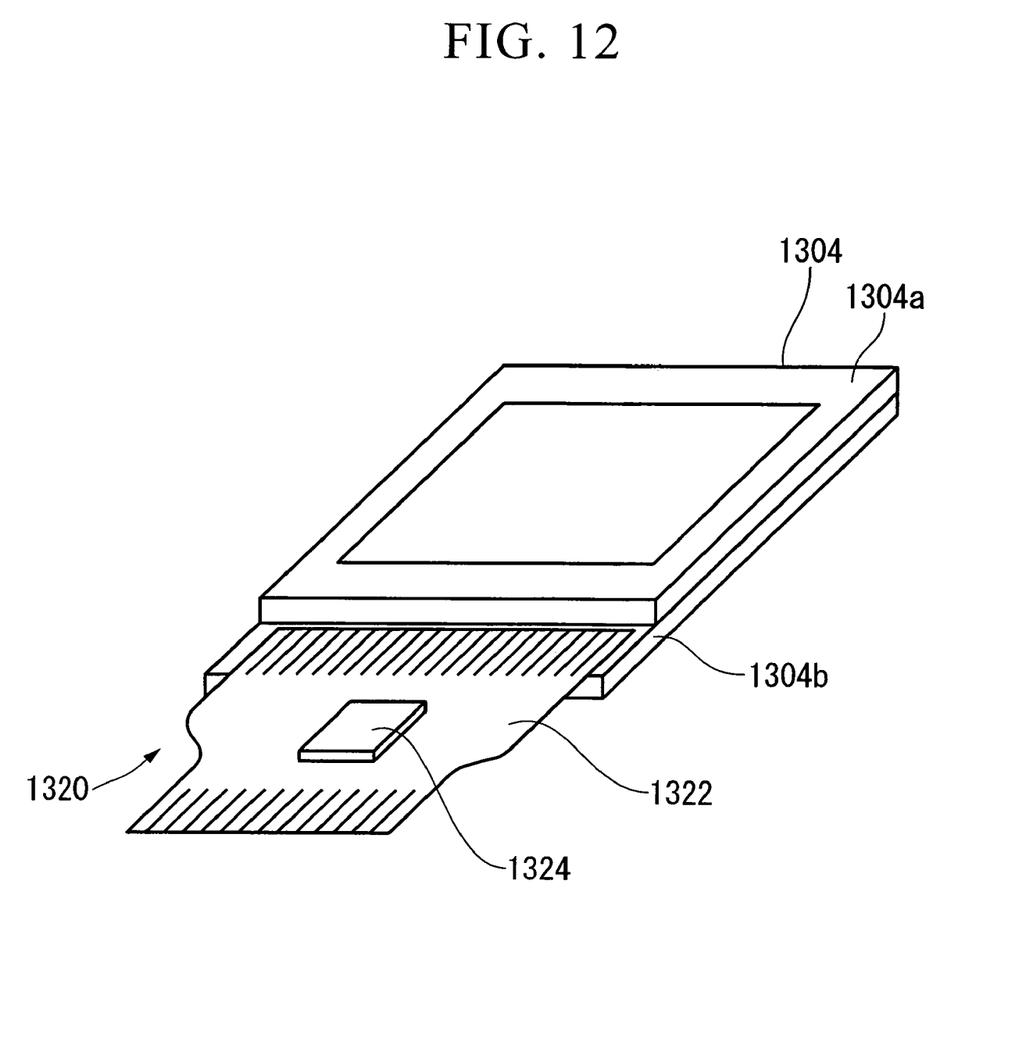
FIG. 12 is a perspective view of a liquid crystal display showing an example of an electronic device of the present invention.

FIG. 12 is a perspective view of a liquid crystal display that is an example of an electronic device fitted with this driving LSI. As shown in this drawing, the liquid crystal display can be constituted by connecting a tape carrier package 1320, in which a driving LSI 1324 is packaged in a polyimide tape 1322, to one of the two transparent substrates 1304a and 1304b that constitute a liquid crystal display 1304.

According to this constitution, by using a driving LSI manufactured using the photomask of the above-described embodiments, an electronic device that can flexibly meet demands for pattern correction and alteration and the like at a low cost and in a short delivery period can be realized.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. For example, the specific disclosures of the constituent material of the light-shielding pattern, and the detailed constitution and manufacturing conditions of the pattern formation apparatus may be suitably changed. The aforementioned embodiments described the example of forming a wiring layer for an ASIC, but are not limited thereto, with it being possible to use the present invention when correcting a light-shielding pattern of a photomask for another semiconductor device. In this case, bug correction can be easily performed at low cost and in a short period, with a substantial effect being obtained. Accordingly, the invention is not to be considered as being limited by the foregoing description, and is only limited by the scope of the appended claims.

What is claimed is:

1. A method of manufacturing a photomask, comprising:
    forming a first light-shielding pattern on a substrate using a photolithographic method; and
    modifying the first light-shielding pattern by forming a second light-shielding pattern on the substrate using the droplet ejection method, the forming of the second light-shielding pattern including
        ejecting droplets of a liquid containing a light-shielding material at predetermined positions on the substrate using the droplet ejection method,
        drying the liquid to form the second light-shielding pattern on the substrate, the second light-shielding pattern containing the light-shielding material, and
        before the drying of the liquid, photo-detecting a top position of droplets landed over the substrate,
        the drying of the liquid including radiating a laser light onto the liquid at the top position of the droplets detected by the photo-detecting.

2. A method of manufacturing a photomask according to claim 1, wherein
    the droplets are ejected onto the substrate in a state of radiating the laser light on the substrate.

3. A method of manufacturing a photomask according to claim 2, wherein
    the droplets are ejected on an ejection target position on the substrate in a state of radiating the laser light on the ejection target position on the substrate.

4. A method of manufacturing a photomask according to claim 2, wherein
    the droplets are dried simultaneously with the droplets landing on the substrate.

5. A method of manufacturing a photomask according to claim 1, wherein
    the ejecting of the droplets includes layering droplets by ejecting a droplet on top of a previously ejected droplet after the previously ejected droplet is dried.

6. A method of manufacturing a photomask according to claim 1, wherein
    a path of the droplets is guided by a laser light.

7. A method of manufacturing a photomask according to claim 6, wherein
the droplets are ejected toward an ejection target position on the substrate in a state of radiating the laser light around the ejection target position on the substrate.

8. A method of manufacturing a photomask according to claim 1, further comprising
trimming at least one of the first and second light-shielding patterns by radiating a laser light or an electron beam onto the at least one of the first and second light-shielding patterns formed on the substrate.

9. A method of manufacturing a photomask according to claim 1, wherein
the second light-shielding pattern belongs to a wiring region among a plurality of light-shielding patterns in the photomask.

10. A photomask manufactured by the method of manufacturing a photomask according to claim 1.

11. A method of manufacturing an electronic device in which a pattern is formed using the photomask according to claim 10.

12. A method of manufacturing a photomask according to claim 1, wherein
the light shielding material includes chromium.

13. A method of manufacturing a photomask according to claim 1, wherein
the modifying of the first light-shielding pattern includes forming the second light-shielding pattern in addition to the first light-shielding pattern.

14. A method of manufacturing a photomask according to claim 1, wherein
the modifying of the first light-shielding pattern includes forming the second light-shielding pattern to correct the first light-shielding pattern.

15. A method of manufacturing a photomask according to claim 1, wherein
the drying of the liquid includes controlling a drying condition for the liquid based on a detection result of the top position of the droplets.

16. A method of manufacturing a photomask according to claim 1, wherein
the forming of the second light-shielding pattern includes trimming the dried droplets on the substrate by radiating a laser light or an electron beam.

17. A method of manufacturing a photomask according to claim 1, wherein
the first shielding pattern belongs to an area having a relatively high pattern density in the photomask, and
the second shielding pattern belongs to an area having a relatively lower pattern density in the photomask.

18. A method of manufacturing a photomask according to claim 1, wherein
the first shielding pattern belongs to at least one of a memory portion and a logic circuit portion of the semiconductor device in the photomask, and
the second shielding pattern belongs to a wiring region of the semiconductor device in the photomask.

19. A method of manufacturing a photomask according to claim 1, wherein
the photo-detecting of the top position of droplets includes photo-detecting a top position of a top one of the droplets layered on top of each other.

20. A method of manufacturing a photomask according to claim 5, wherein
the drying of the liquid includes radiating a relatively low intensity laser light onto the droplet, and
the modifying of the first light-shielding pattern further includes baking the liquid by radiating a relatively high intensity laser light onto the droplets layered on top of each other.

21. A method of manufacturing a photomask according to claim 5, wherein
the drying of the liquid includes setting an intensity of a laser light radiated onto an initially ejected droplet higher than an intensity of a laser light radiated onto the droplets subsequently ejected over the initially ejected droplet.

* * * * *